United States Patent [19]
Chow et al.

[11] Patent Number: 6,060,906
[45] Date of Patent: May 9, 2000

[54] BIDIRECTIONAL BUFFER WITH ACTIVE PULL-UP/LATCH CIRCUIT FOR MIXED-VOLTAGE APPLICATIONS

[75] Inventors: Hwang-Cherng Chow; Cheng-Hsing Chien, both of Hsinchu, Taiwan

[73] Assignee: Industrial Technology Research Institute, Hsinchu, Taiwan

[21] Appl. No.: 09/069,265

[22] Filed: Apr. 29, 1998

[51] Int. Cl.[7] .................. H03K 19/0175; H03K 19/094; H03K 17/16

[52] U.S. Cl. .............................. 326/81; 326/86; 326/121; 326/27; 326/57

[58] Field of Search .................................. 326/80, 81, 57, 326/58, 112, 119, 121, 27, 83, 86

[56] References Cited

U.S. PATENT DOCUMENTS

| | | | |
|---|---|---|---|
| 3,335,296 | 8/1967 | Smart | 327/574 |
| 4,782,250 | 11/1988 | Adams et al. | 326/108 |
| 5,396,128 | 3/1995 | Dunning et al. | 326/68 |
| 5,406,140 | 4/1995 | Wert et al. | 326/68 |
| 5,424,659 | 6/1995 | Stephens et al. | 326/81 |

*Primary Examiner*—Michael Tokar
*Assistant Examiner*—James H. Cho
*Attorney, Agent, or Firm*—Proskauer Rose LLP

[57] ABSTRACT

In a preferred embodiment of the present invention, a bidirectional buffer connects a first device, such as a CMOS chip having a first voltage, such as VDD, to a second device having a second voltage, such as VCC, through a terminal pad. The buffer includes a first driver for driving a terminal pad up to the first voltage, wherein the first driver preferably includes a pair of in series PMOS transistors formed in an n floating well. The buffer further includes a second driver for driving the terminal pad down to a voltage VSS. Such a structure provides a simple circuit that requires only a single terminal pad, a single power supply, and is substantially free of dc leakage currents.

10 Claims, 8 Drawing Sheets

BIDIRECTIONAL BUFFER WITH ACTIVE PULL-UP/LATCH CIRCUIT FOR MIXED-VOLTAGE APPLICATIONS

FIELD OF THE INVENTION

The present invention relates generally to CMOS integrated circuits and, more particularly, it relates to a CMOS buffer circuit, having an active pull-up/latch circuit, suitable for different voltage level interface applications.

DESCRIPTION OF THE PRIOR ART

An integrated circuit includes internal circuitry which generates a digital output signal for transmission to other external circuits. In order to generate the requisite voltage on the output signal pins of the integrated circuit (IC), the IC is typically provided with one or more output buffers. The output buffer has large current driving capacity transistors which can drive a terminal or pad, connected to the output signal pin, to the requisite voltage (i.e., high or low) for conveying the correct logic value (i.e., logic '1' or logic '0') of the output signal.

Recently, power reduction in ICs has become a priority. The most clear sign of this trend is the reduction of the standard power supply voltage VDD from 5V to 3.3V. In addition, there has also been a trend to reduce the power of a 12V supply voltage to 5V. With respect to the reduction 5V to 3.3V, since P=VI, a DC voltage reduction from 5V to 3.3V translates into a power savings of approximately forty percent (with 12V to 5V having a savings of approximately sixty percent). However, during the long anticipated transition period to completely convert from 5V to 3.3V, both 5V and 3.3V digital ICs will be used in system and board designs. For example, a systems memory may operate with a 3.3V power supply but its monitor may require 5V. Thus, a multi-voltage buffer is desired that can supply 5V and 3.3V signals as required.

A bidirectional buffer circuit is a circuit which both transmits output signals from, and receives input signals at, one or more pins of an integrated circuit chip. That is, a group of pins is provided for bidirectional transfer of data, the direction of transfer (i.e., input or output) depending on whether an input operation or output operation is selected at the integrated circuit chip. Conventional bidirectional buffers often use a tri-state or an enable signal for selecting whether an input or output operation is to be performed. For example, when the enable signal is high, the bidirectional buffer circuit translates data generated by internal or core circuits of the integrated circuit to an output signal. Typically, the "translation" step involves generating a voltage at a terminal or pad connected to a pin using an output driver comprising one or more large transistors, with a large current driving capacity for driving a high impedance load. When the enable signal is low, the output driver is disabled and instead functions as a high impedance load. An inputted signal can then be received at the terminal or pad via the pin.

FIG. 1 shows a conventional 3.3V bidirectional (input/output) buffer circuit 10. Buffer circuit 10 comprises two stages; the input buffer stage 20 and the output buffer stage 30. Depending on the value of the Output Enable (OEN) control signal, the bidirectional buffer may act as an input buffer or as an output buffer. For example, when the OEN signal has a value of logic '1', buffer circuit 10 acts as an input buffer, and when the OEN signal has a value of logic '0', buffer circuit 10 acts as an output buffer. During the input phase, the driver transistors P1 and N1 are both off since the voltage levels at their respective gates are VDD and VSS, respectively. However, when a 5V input signal is applied on pad 15, two conducting paths to the 3.3V power supply will appear (as indicated by arrows 35 and 40). First, the parasitic diffusion diode D1 connected to the N-well of transistor P1 will open (become forward biased). Second, P1 itself will conduct current from pad 15 to the 3.3V power source VDD since its gate-to-drain voltage is larger than its threshold voltage (in absolute value). Therefore, hazards, such as functional failure, may occur due to the loading value of the input signal and due to the reverse current in the power supply.

To eliminate the first conducting current path 40, the N-well of transistor P1 has to be tied to the 5V power supply. However, the second conducting current path 35 remains. In addition, this arrangement results in other disadvantages including requiring dual power sources in the corresponding chip (e.g., 3.3V/5V or 5V/12V) and requiring an additional bonding pad for connecting the P1's N-well to the external power source.

FIG. 2 shows another conventional bidirectional buffer circuit as described in "5V Compatibility with 3.3V-Only CMOS ASICs", Microelectronics Journal, Vol 23, No. 8, 1992 by Henderson and Gal. Specifically, buffer circuit 50 includes a PMOS transistor T1 formed in an N-well that is connected to a 5V power source 80 to avoid a forward biased condition on its parasitic diode. Furthermore, NMOS transistors T2 and T4/T5 reduce the stress voltage located at the drain of transistor T3 and at the gate of input buffer inverter 60, respectively. However, as with buffer circuit 10, the disadvantages of buffer circuit 50 include requiring dual power sources in the corresponding chip and requiring an additional bonding pad for connecting the P1's N-well to the external power source. Further, a leakage current flows at transistor T1 from pad 70 to the 3.3V power source 90.

Another conventional buffer circuit is described in U.S. Pat. No. 5,300,835 to Assar et al. and is shown in FIG. 3. In buffer circuit 200, data DO and enable signal OEN* are first translated to voltage level NVDD by utilizing voltage translators. The voltage translator for signal DO comprises an inverter consisting of transistors 270 and 271 and cross wired transistors 266–269. The voltage translator for signal OEN* comprises an inverter consisting of transistors 276 and 277 and cross-wired transistors 272–275. Accordingly, PMOS driver transistor 250 can be completely off even when a high input signal, having a voltage level at NVDD, is applied to the pad. Although, unlike buffer circuit 10, the conducting current paths are eliminated, the buffer circuit 200 requires at least two power sources which require additional chip real estate for the supplemental power lines, bonding pad and connecting pins.

FIG. 4 is a further conventional bidirectional buffer circuit which is disclosed in "A 3/5 V Compatible I/O Buffer", IEEE Journal of Solid-State Circuits, July 1995 by Pelgrom and Dijkmans. As described in the disclosure, buffer circuit 100 provides the advantages of having a single power source and a single bonding pad, while exhibiting no leakage current of transistor P1. Buffer circuit 100 is fabricated using a 'floating N-well' circuit technique. That is, the PMOS transistors P1–P8 are formed in a floating N-well.

In operation, when buffer circuit 100 acts as an output buffer, the floating N-well is normally biased to 3.3V to keep the diffusion diode (at each PMOS transistor's p-n junction) reverse biased. In this condition, control signal OEN is logic '0' and transistor P4 is turned-on to charge the floating N-well to 3.3V (transistor N6 passes the logic '0' value to the gate of transistor P4). Conversely, when OEN is logic '1', buffer circuit 100 acts as an input buffer. When a 5V input is applied, the floating N-well is directly charged to (5V−$V_{diodedrop}$=4.3V), where $V_{diodedrop}$ is the voltage drop of diode D1. When a 0V input is applied, the voltage level of the floating N-well is discharged to (3.3+|Vtp|) volts at PMOS transistor P6, where Vtp is the threshold of transistor P6. Since the voltage level of the floating N-well is switched between two different values, buffer circuit 100 may induce latch-up. In addition, buffer circuit 100 is rather complex and requires a relatively large layout area.

It is therefore the object of the present invention to provide a simple circuit design for a bidirectional multi-voltage buffer.

A further object of the present invention is to minimize the dc leakage current between the bonding pad and the power source.

An additional object of the present invention is to design a bidirectional buffer having a single power source.

Another object of the present invention is to design a bidirectional buffer having a single bonding pad.

Yet a further object of the present invention is to minimize latch-up of a bidirectional buffer.

SUMMARY OF THE INVENTION

These and other objects are achieved by the present invention. The present invention provides a bidirectional buffer which connects a first device, such as a CMOS chip having a first voltage, such as VDD, to a second device having a second voltage, such as VCC, through a terminal pad. The buffer includes a first driver for driving a terminal pad up to the first voltage, wherein the first driver preferably includes a pair of in series pull-up PMOS transistors formed in an n floating well. The buffer further includes a second driver for driving the terminal pad down to a voltage VSS.

Such a structure provides a simple circuit that requires only a single terminal pad, a single power supply, and is substantially free of dc leakage currents.

As an aspect of this embodiment, the series transistors are PMOS transistors, where one PMOS transistor, having its source connected to VDD, has a driving capacity approximately three times greater than the other PMOS transistor, having its drain connected to the terminal pad.

As a further aspect of this embodiment, all PMOS transistors are separated from all NMOS transistors, such as those in the second driver or in a control circuit, by the terminal pad.

As an additional aspect of this embodiment, the first and second drivers are fabricated using the known double guard ring technique.

In a second embodiment, the PMOS series transistors form a latch circuit in lieu of the pull-up circuit in the first embodiment. In addition, the second embodiment includes a push-pull driver comprising a pair of NMOS transistors.

In a third embodiment, the PMOS series transistors have a medium driving capacity and also form a latch circuit in lieu of the pull-up circuit in the first embodiment. In addition, the third embodiment includes a push-pull driver comprising a pair of NMOS transistors having a strong driving capacity. A weak NMOS transistor is also included as a weak pull-up device. Further, a rising edge detector circuit is provided to determine the value of a control signal indicating whether the terminal will be in a high or low stage and whether the buffer will be in an input or an output mode.

BRIEF DESCRIPTION OF THE DRAWINGS

The following detailed description, given by way of example and not intended to limit the present invention solely thereto, will best be understood in conjunction with the accompanying drawings, where similar elements will be represented by the same reference symbol, in which.

DETAILED DESCRIPTION OF THE INVENTION

Figure 1:
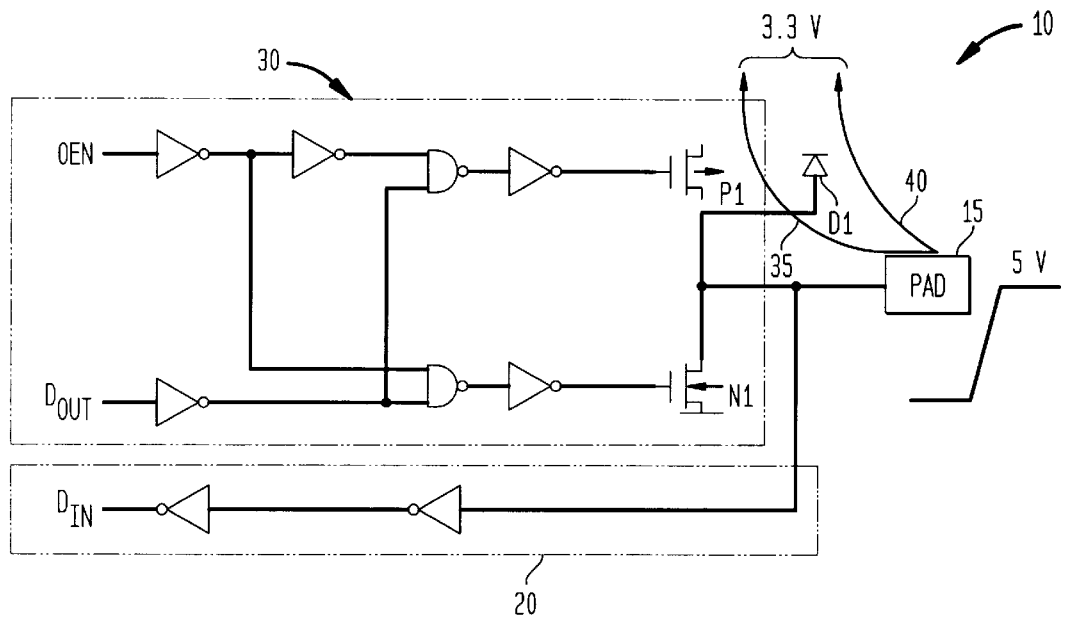
FIG. 1 shows a first conventional bidirectional buffer.
Figure 2:
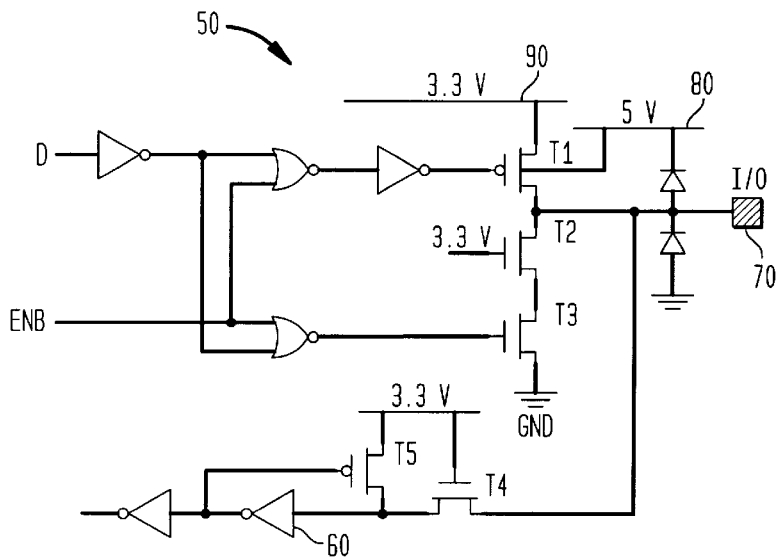
FIG. 2 shows a second conventional bidirectional multi-voltage buffer.
Figure 3:
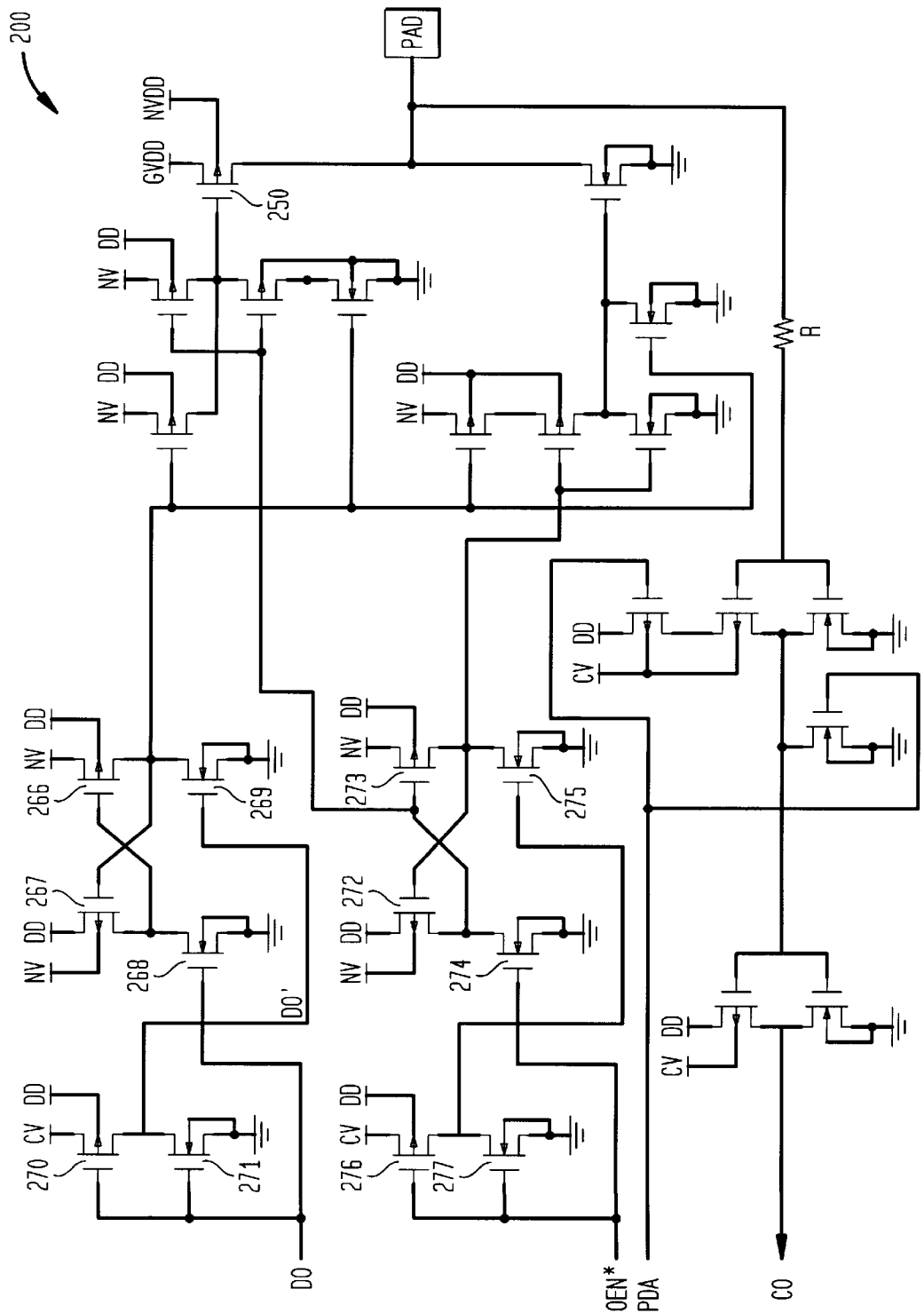
FIG. 3 shows a third conventional bidirectional multi-voltage buffer.
Figure 4:
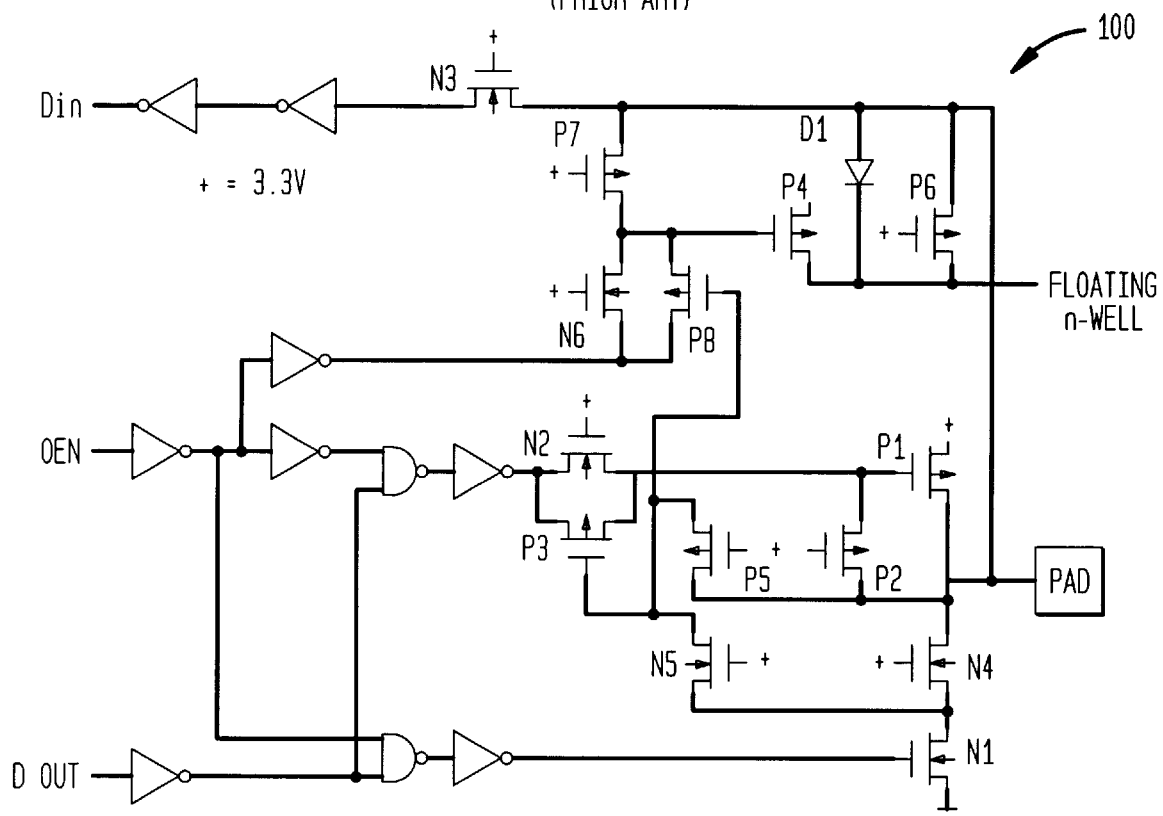
FIG. 4 shows a fourth conventional bidirectional multi-voltage buffer.
Figure 5:
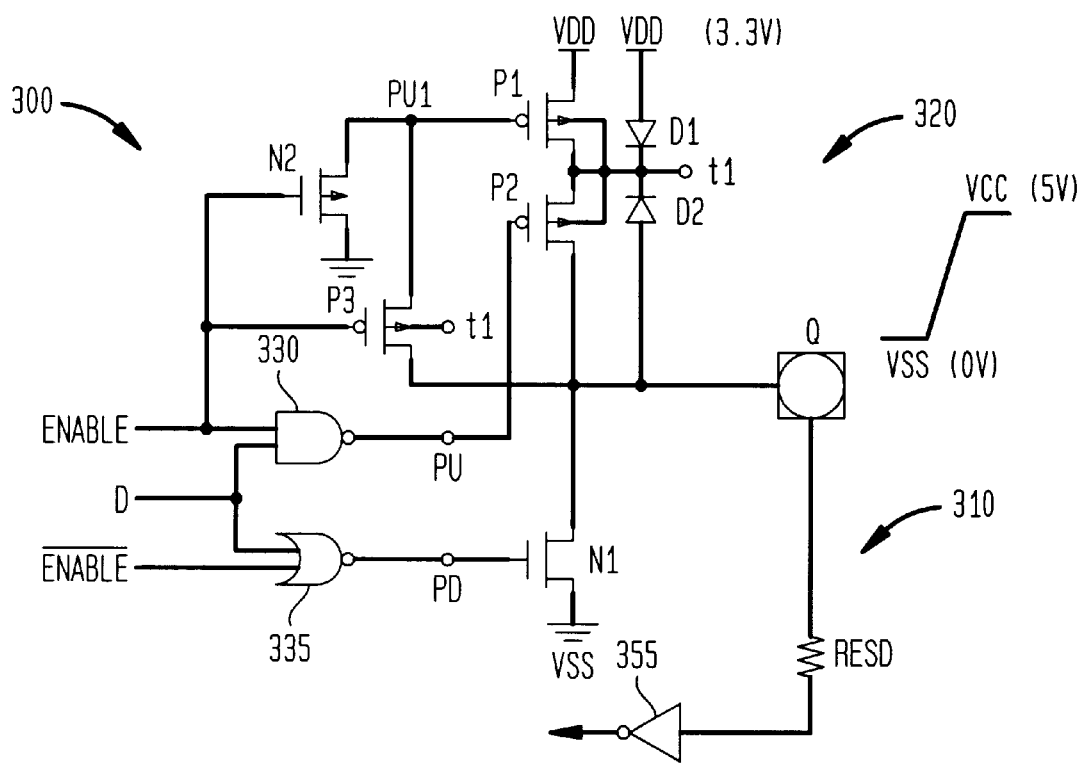
FIG. 5 shows a bidirectional multi-voltage buffer according to a first embodiment of the present invention.

FIG. 5 shows a bidirectional multi-voltage buffer circuit 300 according to a first embodiment of the present invention. Although each transistor in buffer 300 is illustrated as either n or p type, it should be understood that the conductivity type is interchangeable with little or no modification.

As shown, buffer 300 comprises an output buffer portion 320 for driving bonding pad Q and an input buffer portion 310 for receiving signals from pad Q. Output buffer portion 320 includes pull-up driver transistors P1 and P2; pull-down driver transistor N1; predrivers N2, P3, NAND gate 330 and NOR gate 335; and parasitic diodes D1 and D2. Input buffer portion 310 includes an electrostatic discharge protection resistor Resd and an inverter 355. Illustratively, inverter 355 includes a PMOS transistor connected to an NMOS transistor in a standard "push-pull" invertor configuration (not shown).

With respect to transistors P1 and P2, it is important to note that they are connected in series and are arranged in a floating N-well. In other words, the N-well is not connected to a fixed voltage. Due to the N-well connection, the two parasitic diodes D1 (P1's source to the N-well) and D2 (P2's drain to the N-well) connected cathode to cathode.

In buffer 300, output signal D is supplied to NAND gate 330 and NOR gate 335. Output signal D rises and falls from logic '0' to '1', as desired. Thus, when signal D is high, buffer 300 will output a high voltage at pad Q (e.g., 3.3V). Conversely, when signal D is low, buffer 300 will output a low voltage at the pad (typically 0V). Along with signal D, enable control signal and enable control signal complement are supplied to NAND gate 330 and NOR gate 335, respectively. The enable control signal determines whether buffer 300 will act in its input or in its output mode. Preferably, when enable=1, the buffer is in its output mode. Similarly, when enable=0, the buffer is in its input mode.

Figure 8:
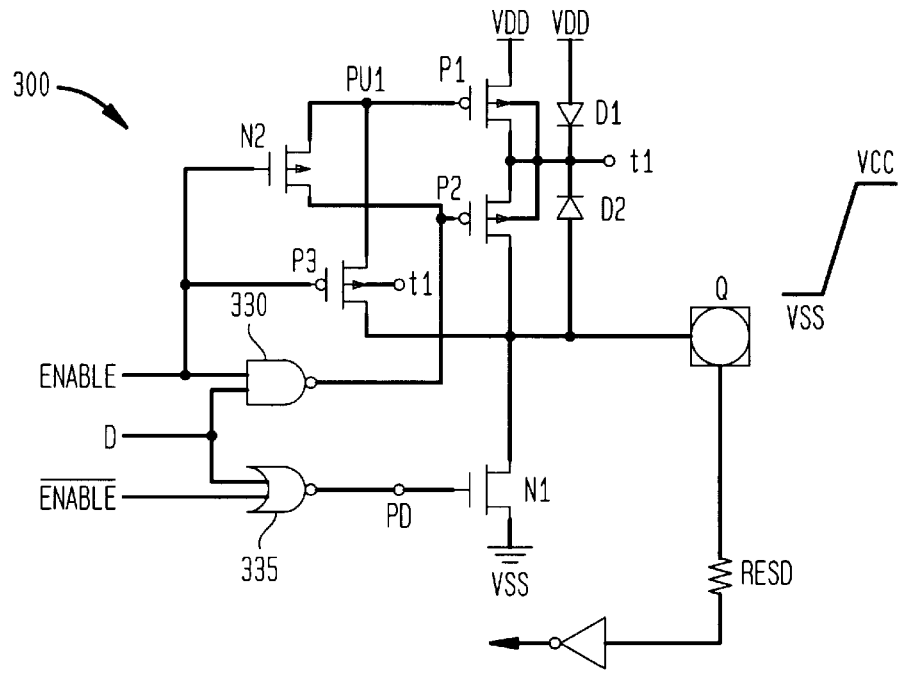
FIG. 8 shows an alternate bidirectional multi-voltage buffer according to the first embodiment of the present invention.

The output of the NAND gate, PU, is supplied to PMOS transistor P2, while the output of the NOR gate, PD, is supplied to NMOS transistor N1. In addition, the enable signal is supplied to control transistors N2 and P3. These control transistors act as push-pull transistors to quickly activate or deactivate signals to transistor P1. Note that transistor P3 can be arranged such that its N-well can be tied to the floating N-well t1 or to pad Q. Note too that the source of transistor N2 (shown connected to VSS in FIG. 5) can also be connected directly to the gate of transistor P2 (shown in FIG. 8) with similar operational results.

The operation of buffer 300 will now be described. Consider when Enable=1, that is, the bidirectional buffer is for output use. In this condition, transistor P3 is off, while N2 is turned on to make the voltage level of node pu1 0. Since a low voltage is applied to the gate of pull-up driver transistor P1, P1 pulls the voltage potential of the floating N-well (t1) up to 3.3V. Therefore, the floating N-well is biased to 3.3V when the buffer outputs data. Since Enable=1, the NAND and NOR gates are merely logically inverters.

When output data D is 1, signals PU and PD are both at 0. In this condition, transistor N1 is off, while transistors P1 and P2 are on to pull output terminal Q up to 3.3V. In contrast, when output data D is 0, both signals PU and PD are both at 1. In this condition, transistor P2 is off while pull-down driver transistor N1 is on to pull output terminal Q down to 0V.

Consider now when output data D makes a transition from 1 to 0. As the signal D decreases, the output of the NOR gate increases, such that transistor N1 is turned on. Simultaneously, the output of the NAND gate increases, such that transistor P2 begins to cut off. Since the pull-down driver transistor N1 is on, the output terminal Q discharges all the way down to VSS.

Consider now when output data D makes a transition from 0 to 1. As the signal D increases, the output of the NOR gate decreases, such that transistor N1 is turned off. Simultaneously, the output of the NAND gate decreases, such that transistor P2 begins to conduct. Since the pull-up driver transistors P1, P2 are on, the output terminal Q charges all the way up to VDD.

To ensure proper operation, the following three design principles are given which also enhances latchup immunity. It should first be noted that when the output terminal Q transitions from VSS to VDD, typically two charge paths are generated. The first path is through the transistors P1 and P2. The second path is through diode D1 and transistor P2. The second path is not desired since the parasitic diode D1 becomes forward-biased. In other words, if D1 is forward biased, it will have the undesirable affect of pulling-up terminal Q which will potentially cause a latchup problem.

Accordingly, in the first design principle, it is preferable that the strength of transistor P1 is stronger than that of transistor P2. If the P1's strength is stronger than P2's (e.g., 3 or 4 times greater), then the voltage potential of floating N-well t1 can be kept close to 3.3V. This will occur since the charge flowing out through P2 is less than the charge supplied from VDD through P1. In this manner, the diode D1 is remains in a reversed-biased state.

Secondly, it is preferable that the PMOS and NMOS devices be separated by the terminal pad Q. If the PMOS and NMOS devices are laid-out in the opposite sides of the bonding pad, a potential latchup between different conductivities may never arise.

Thirdly, it is preferable that the bidirectional buffers be fabricated using the known double guard ring structure. This layout technique will further prohibit latchup.

Consider now when Enable=0, that is, the bidirectional buffer is for input use. In this case, transistor N2 is off, while transistor P3 is on. Control signal PU is at 3.3V, while control signal PD is at 0V. When the input signal applied to terminal Q is at 0 (i.e., 0V), the low voltage state can be sustained. When the input signal applied to terminal Q is 1 (i.e., 5V), the high voltage state can be sustained, as well. Under this condition, node pu1 is pulled up to 5V since transistor P3 is on. Transistor P2 is also turned on because its gate-to-drain voltage is −1.7V (3.3V−5V). Therefore, node t1 is pulled up to 5V. As the gate and drain of transistor P1 are both 5V, transistor P1 remains off. Since diode D1 is reverse-biased, the bidirectional buffer does not have a dc leakage current for either output or input directions.

Figure 6:
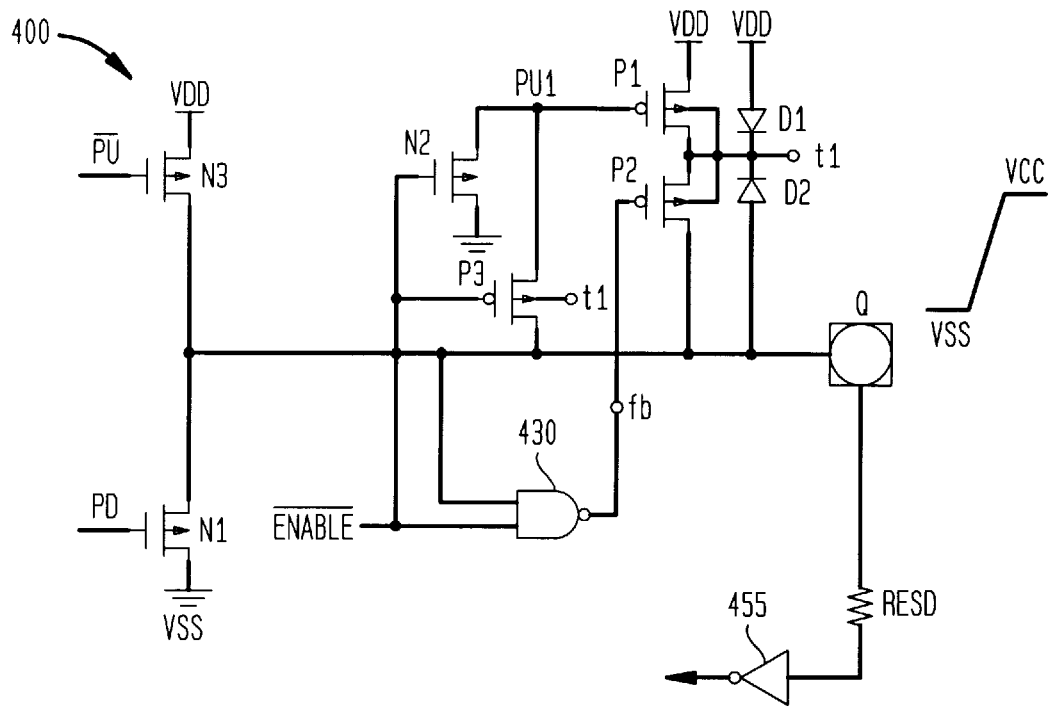
FIG. 6 shows a bidirectional multi-voltage buffer according to a second embodiment of the present invention.

FIG. 6 shows a bidirectional multi-voltage buffer circuit 400 in accordance with a second embodiment of the present invention. As compared to the first embodiment in FIG. 5, the series transistors P1 and P2 are now used as a latch circuit (as opposed to a pull-up driver circuit). In this embodiment, transistor N3 acts as a pull-up driver having a control signal PU complement.

In operation, when output data is 1, terminal Q is first pulled up to a so-called "poor" high voltage (VDD−Vt), where Vt is the threshold voltage of N3. This poor high voltage causes NAND gate 430 to output logic low through point fb, when Enable=1. In this case, transistors P1 and P2 are turned on, such that the output terminal Q is then pulled up to VDD. Note that transistor N3 is turned off (i.e., the gate and drain of N3 are both VDD). Since transistor P2 is controlled by the feedback voltage of Q, the series transistors P1 and P2 are referred to as a latch circuit.

Consider now when Enable=0, that is buffer 400 is for input use, such that transistor P3 is on. Assume that the applied input signal is 5V. In this case, NAND gate 430 outputs 1 (3.3V) through point fb. Although the gate of transistor P2 is at 3.3V, its drain is 5V so transistor P2 begins to conduct due to its gate-to-drain voltage=−1.7V (3.3V−5V). As transistor P2 is turned on, P2 pulls the potential of N-well t1 up to 5V. Note too that pu1 is pulled up to 5V, as well. Since the gate and drain of transistor P1 are both 5V, buffer 400 will exhibit substantially no dc leakage current. When the input data is 0V, NAND gate 430 also outputs 1 (3.3V), such that transistor P2 turns off to sustain the 0V input.

Figure 7:
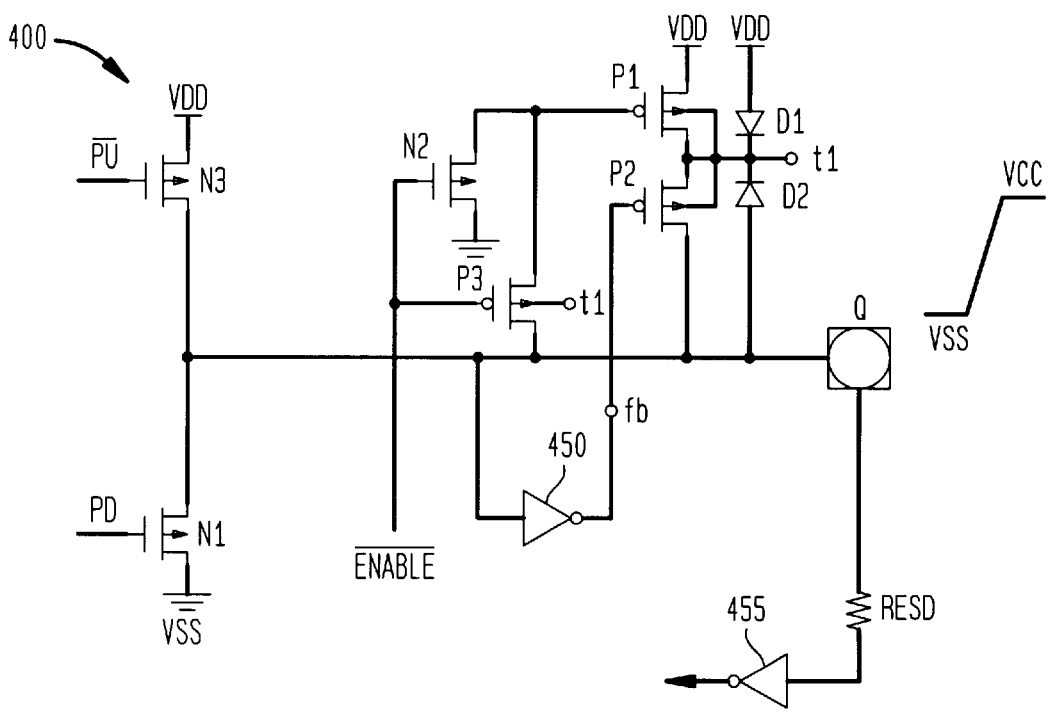
FIG. 7 shows an alternate bidirectional multi-voltage buffer according to the second embodiment of the present invention.

FIG. 7 shows an alternate bidirectional buffer in accordance with the second embodiment of the present invention. In this alternate, NAND gate 430 is replaced with a simple inverter 450. However, the operation of the buffer of FIG. 7 remains essentially similar to that of FIG. 6.

Figure 9:
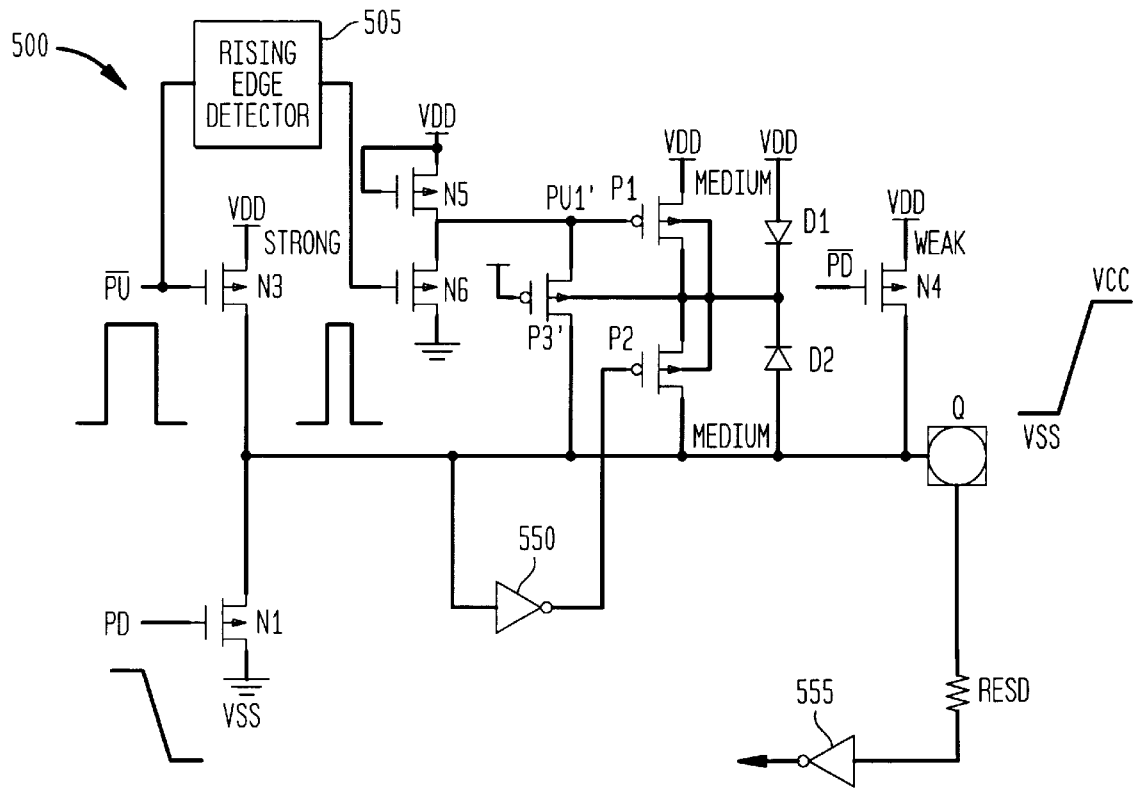
FIG. 9 shows a CMOS quasi-bidirectional multi-voltage buffer in accordance with a third embodiment of the present invention.

FIG. 9 shows a CMOS quasi-bidirectional multi-voltage buffer 500 in accordance with a third embodiment of the present invention. In short, a quasi-bidirectional buffer offers both input and output functions without the traditional output enable control signal.

As compared to buffer 400 of FIG. 7, a rising edge detector circuit 505, as well as additional control transistors N4, N5, N6 and P3' are added. The strength of transistor N3, transistors P1 and P2, and transistor N4 are strong, medium, and weak, respectively. For reference, a strong strength transistor has, e.g., 100 times the driving capacity of a weak transistor, and a medium strength transistor has, e.g., 10 times the driving capacity of the weak transistor. In other words, strong transistors are so called because the transistors are large and have a large driving capacity. Similarly, weak transistors are so called because the transistors are small and have a small driving capacity, while medium transistors fall in-between.

In buffer 500, transistor N4 is used as a weak pull-up device having at most a driving capacity of VDD−Vt. The strong pull-up driver N3 is referred to as a transient part circuit. That is, it is only turned on for a limited time interval by a "one-shot" control signal, PU complement, depending on the rise and fall of the signal. Similar to FIG. 7, transistors P1 and P2 are also used as a latch circuit (which latches the voltage level at terminal Q to VDD).

Consider first when buffer 500 is an output buffer. When the buffer outputs data 1, transistor N3 is activated by the one-shot control signal PU complement to pull terminal Q up to VDD−Vt. Note that control signal PD is 0, so transistor N4 is on. Simultaneously, the above one-shot signal is supplied to rising edge detector circuit 505 to generate a second one-shot signal having substantially less pulsewidth. This second one-shot signal turns on transistor N6 which discharge charges node pu1' for a short time. Thereafter, transistor N5 will bias transistor P1, such that transistor P1 is turned on.

Once the first large one-shot signal transitions to low (0V), transistor N3 begins to shut off. The poor high voltage (VDD−Vt) causes the inverter to output a 0 value and therefore, transistor P2 turns on. Thus, latch circuit P1 and P2 pulls up terminal Q to VDD (3.3V). Once terminal Q reaches 3.3V, transistor N4 turns off.

Consider now when the buffer outputs data 0. Control signal PD is 1, which turns on transistor N1. Note that the rising edge detector is has no effect this situation. As transistor N1 begins to pull terminal Q down to 0V, the decreasing voltage causes inventer 550 to output a high (3.3V) level. As a consequence, transistor P2 is completely off. Therefore, the voltage level of terminal Q is pulled down to VSS (0V).

Note that in this case, the first large one-shot signal is an enable control signal. That is, after the one-shot signal completes its transition, buffer 500 is ready in either its input mode or it continues to output the next data. This is due to the fact that the output terminal Q sustains 3.3V only by the series transistors P1 and P2, while strong transistor N3 and weak transistor N4 are off.

For an input signal of 0V, the inverter outputs a high (3.3V) level, such that transistor P2 begins to cut off. Thus, the applied 0V signal can be sustained. For an input signal of 5V, the inverter outputs a low (0V) level, such that transistor P2 is on and pulls N-well t1 to 5V. In this case, transistor P3' begins to conduct and pulls node pu1' to 5V. As mentioned above, transistor P1 is now completely off since its gate and drain are both 5V. Similarly, transistor N5 is off as well. Therefore, no dc current flows from VDD to VSS through transistors P1 and P2. Note that diode D1 is reverse-biased under this condition.

Figure 10A:
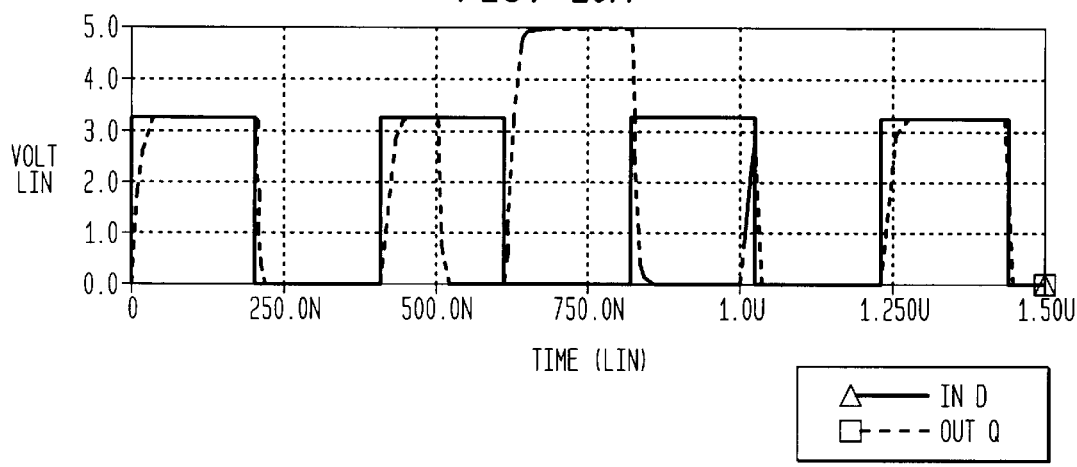
FIG. 10 illustrates voltage over time simulation results for the circuit of FIG. 5.
Figure 10B:
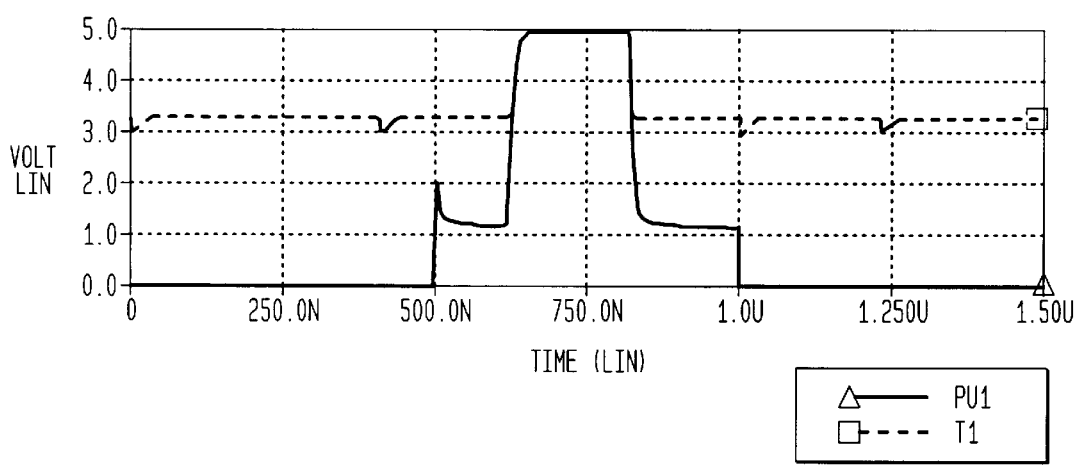
Figure 10C:
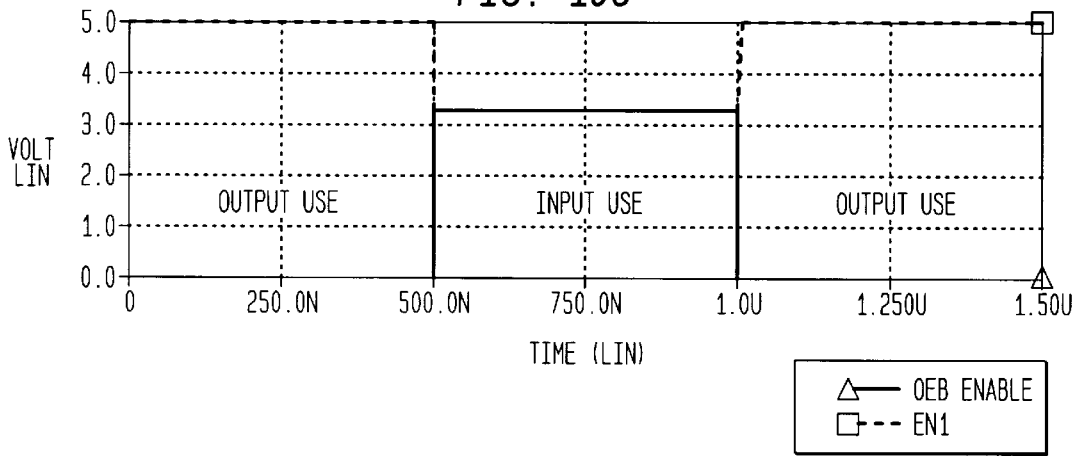
Figure 11A:
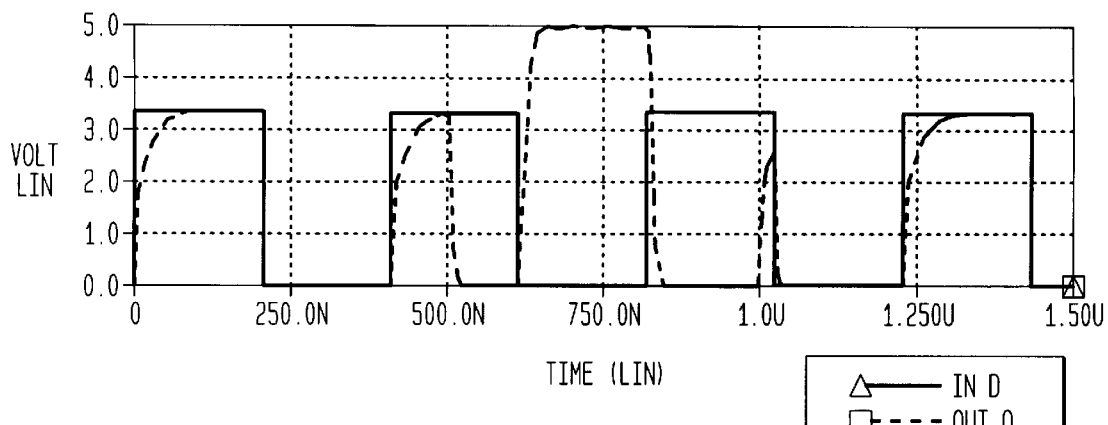
FIG. 11 illustrates voltage over time simulation results for the circuit of FIG. 7.
Figure 11B:
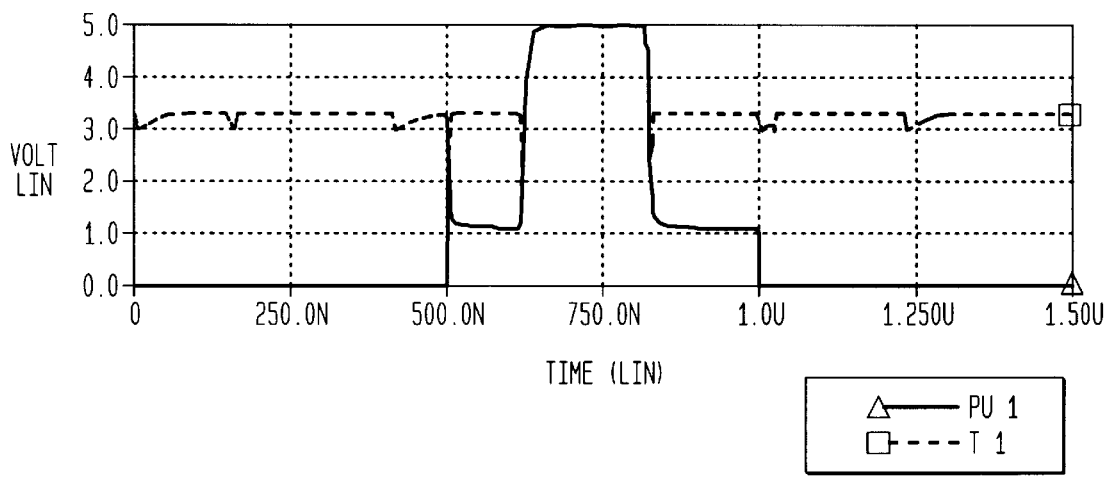
Figure 11C:
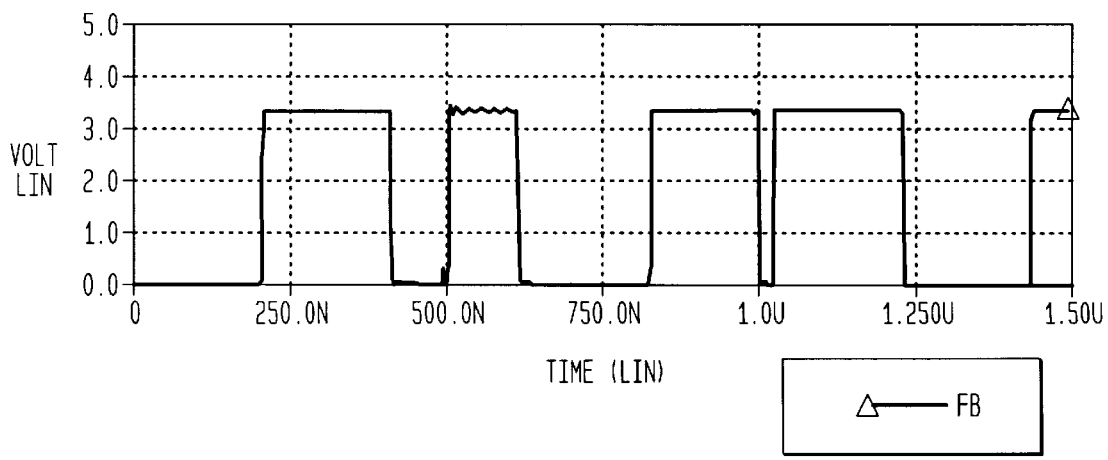

FIGS. 10 and 11 are simulation results based on the buffers of FIGS. 5 and 7, respectively. In these two examples, transistor P1 has a driving capacity 3 times that of transistor P2. Judging from this simulation results, proper circuit operations are achieved.

Finally, the above-discussion is intended to be merely illustrative of the invention. Numerous alternative embodiments may be devised by those having ordinary skill in the art without departing from the spirit and scope of the following claims.

The claimed invention is:

1. A bidirectional buffer for connecting a first device having a first voltage to a second device having a second voltage, comprising:
   a first driver for driving a terminal pad up to said first voltage, wherein said first driver comprising a pair of in series transistors formed in an n floating well;
   a second driver for driving said terminal pad down to a voltage VSS; and
   an NMOS transistor having its drain connected to a gate of one of said series transistors, its source connected to a gate of the other of said series transistors, and its gate connected to receive an enable signal.

2. The bidirectional buffer of claim 1, further comprising a PMOS transistor having its source connected to the gate of said one of said series transistors, its drain connected to said terminal pad and its gate connected to receive an enable signal.

3. The bidirectional buffer of claim 2, wherein said series transistors being a pair of PMOS transistors, and wherein said PMOS and NMOS transistors being separated by said terminal pad.

4. The bidirectional buffer of claim 1, further comprising a push-pull inverter having a pair of transistors, wherein said series transistors acts as a latch circuit.

5. The bidirectional buffer of claim 1, wherein said series transistors are pull-up driver transistors.

6. The bidirectional buffer of claim 1, wherein said series transistors are configured such that one of said series transistors having a driving capacity at least as great as the driving capacity of the other of said series transistors.

7. The bidirectional buffer of claim 1, wherein said first and second drivers being formed using a double guard ring technique.

8. A bidirectional buffer for connecting a first device having a first voltage to a second device having a second voltage, comprising:
   a first driver for driving a terminal pad up to said first voltage, said first driver comprising a pair of in series transistors formed in an n floating well, wherein said series transistors acts as a latch circuit;
   a second driver for driving said terminal pad down to a voltage VSS;
   a push-pull inverter having a pair of transistors; and
   a weak pull-up transistor coupled between said terminal pad and said first voltage, wherein at least one of said transistors of said push-pull inverters being strong, and wherein said series transistors being medium, wherein a strong transistor has a driving capacity many times greater than the driving capacity of a weak transistor, and wherein a medium transistor having a driving capacity less than that of said strong transistor and greater than that of said weak transistor.

9. The bidirectional buffer of claim 8, wherein said strong transistor has a driving capacity approximately one hundred times greater than the driving capacity of said weak transistor, and wherein said medium transistor having a driving capacity approximately ten times greater than the driving capacity of said weak transistor.

10. The bidirectional buffer of claim 9, further comprising a rising edge detector circuit.

* * * * *